United States Patent [19]

Moore

[11] 4,242,720
[45] Dec. 30, 1980

[54] INTEGRATED CIRCUIT MOUNTING BOARD HAVING INTERNAL TERMINATION RESISTORS

[76] Inventor: Donn Moore, 4950 Marmol Dr., Woodland Hills, Calif. 91364

[21] Appl. No.: 831,895

[22] Filed: Sep. 9, 1977

[51] Int. Cl.³ .............................................. H05K 1/04
[52] U.S. Cl. ................................ 361/402; 361/414; 361/424; 338/309
[58] Field of Search ................. 361/414, 424, 402; 333/84 M; 338/307, 308, 309

[56] References Cited

U.S. PATENT DOCUMENTS

| | | | |
|---|---|---|---|
| 3,102,213 | 8/1963 | Bedson et al. | 361/414 |
| 3,316,618 | 4/1967 | Guarracini | 361/414 |
| 3,488,429 | 1/1970 | Boucher | 361/414 |
| 3,876,822 | 4/1975 | Davy et al. | 174/68.5 |
| 3,891,898 | 6/1975 | Damon | 361/414 |
| 3,964,087 | 6/1976 | Mallon | 174/68.5 |
| 4,047,132 | 9/1977 | Krajewski | 361/414 |

OTHER PUBLICATIONS

*Augat Data Sheet,* AA1, AA3, AA4, Revised Jan. 1974, Augat Inc.

Technical Bulletin, The Mica Corp.

*Primary Examiner*—David Smith, Jr.
*Attorney, Agent, or Firm*—Christie, Parker & Hale

[57] ABSTRACT

A logic card for interconnection of integrated circuits comprises a laminate for supporting integrated circuit devices. The laminate includes a relatively highly conductive layer. A selected plurality of holes are formed through the laminate in selected patterns at each of a plurality of stations on the laminate. A conductor is disposed in each of the holes. The conductors comprise, in each pattern, first and second groups of conductors. The conductors in each first group have one end effectively exposed on one side of the laminate and the conductors in each second group in each pattern have their opposite ends effectively exposed on opposite sides of the laminate, thus adapting the conductors for connection thereto of either or both of a lead from an integrated circuit and a conductor wire. Coupling means are located internally of the laminate for coupling the conductive layer to the in-hole conductors of the first group in each pattern and defining between the conductive layer and each said conductor a transmission line termination device.

29 Claims, 30 Drawing Figures

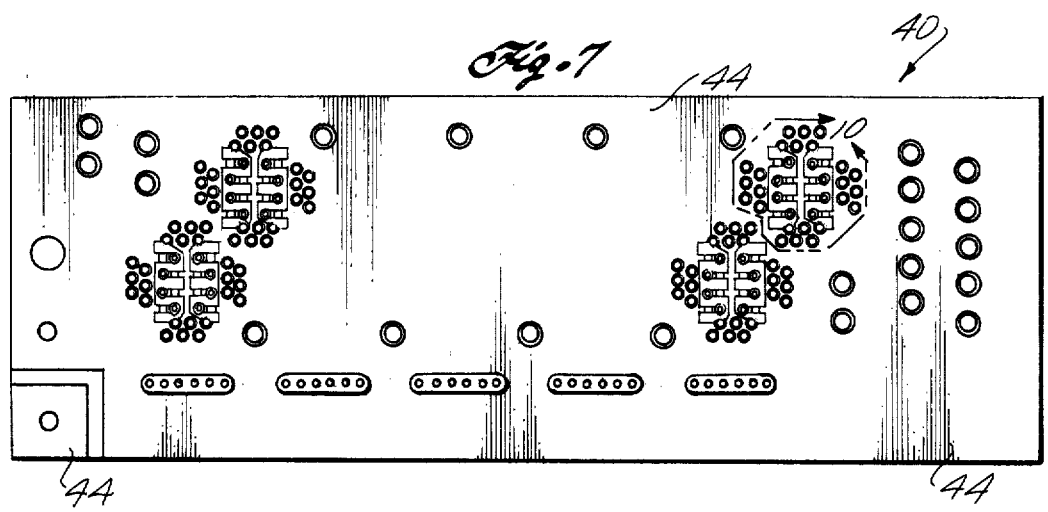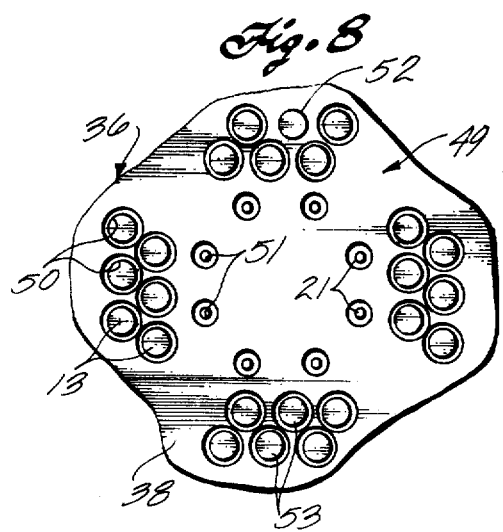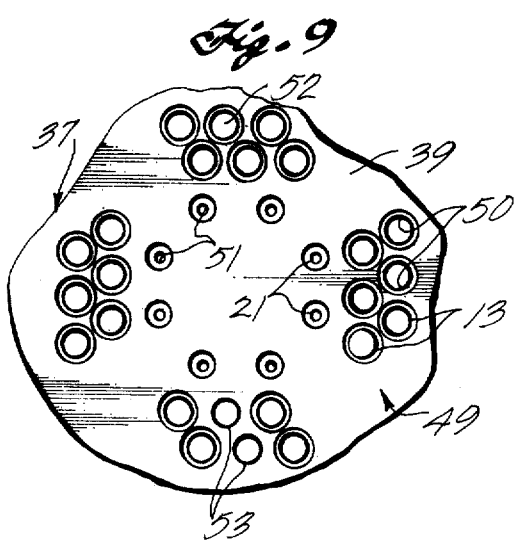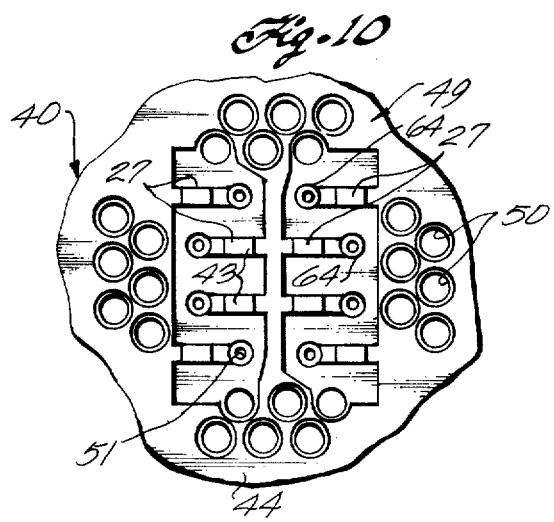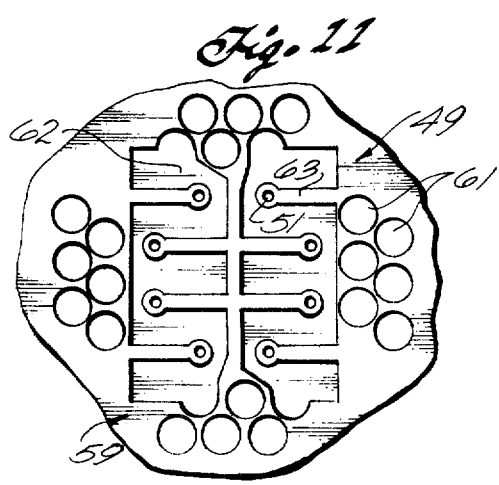

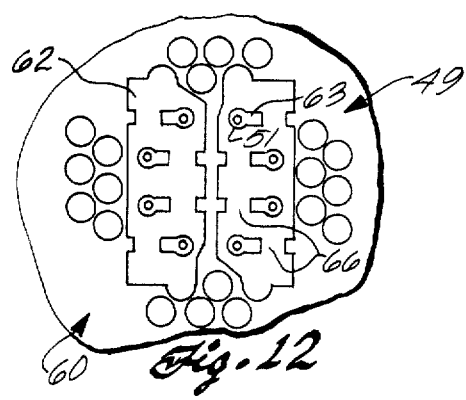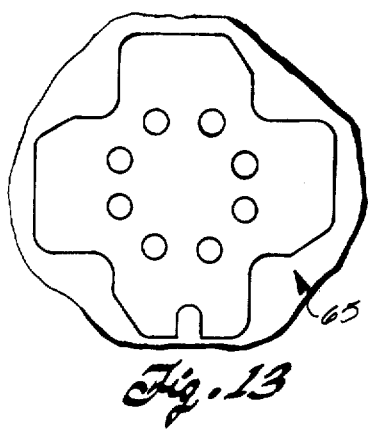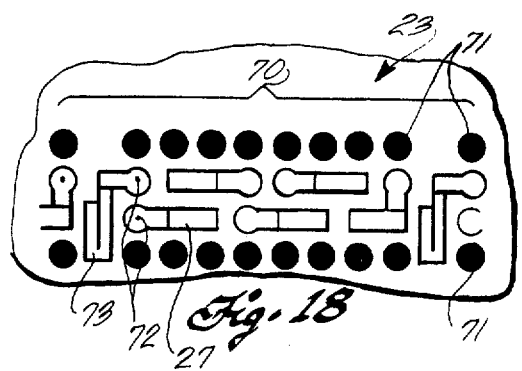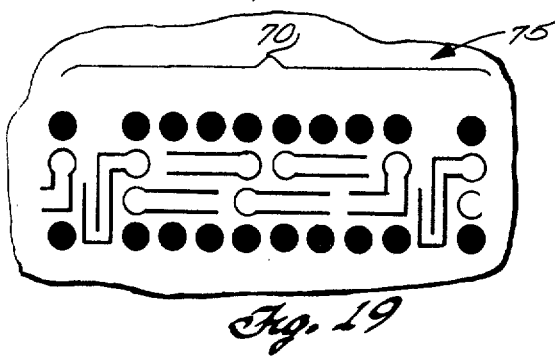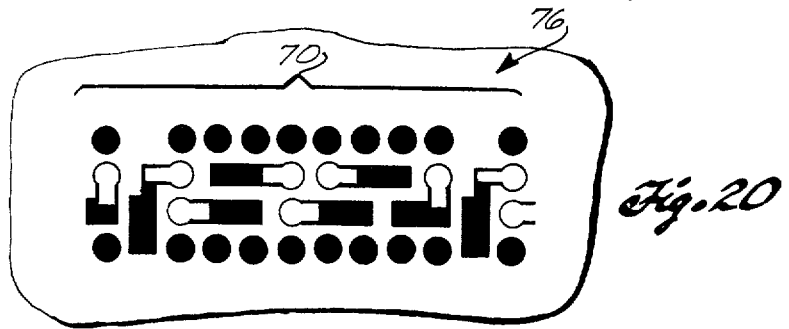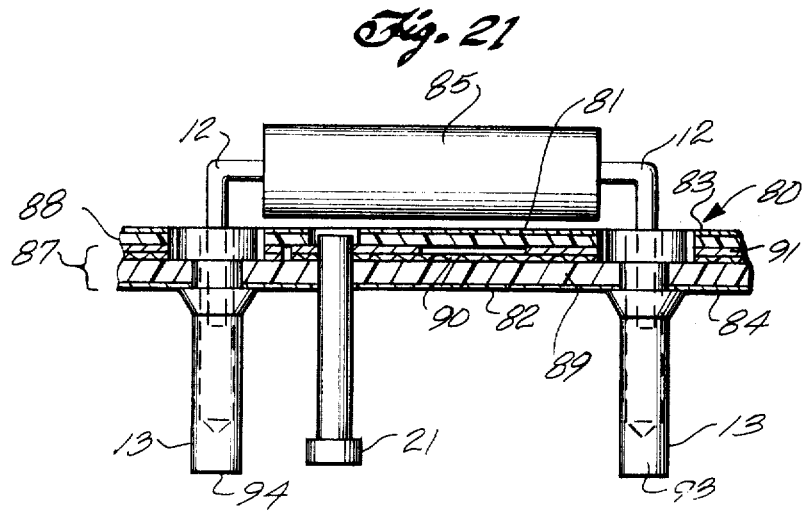

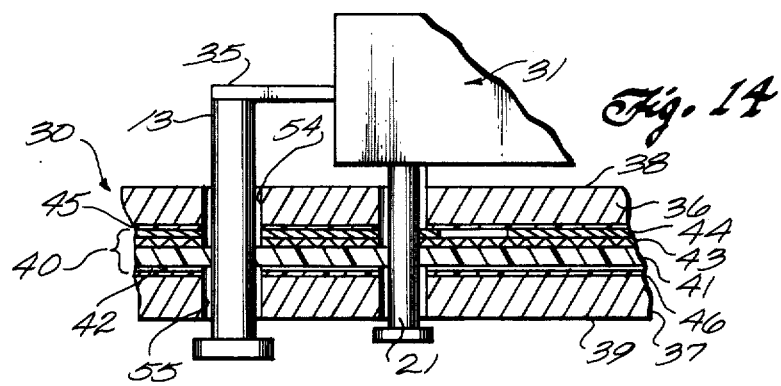
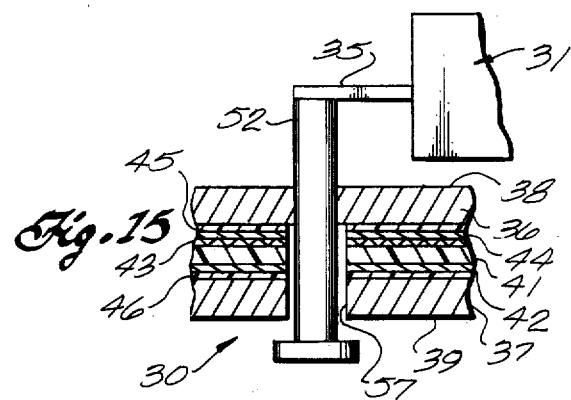
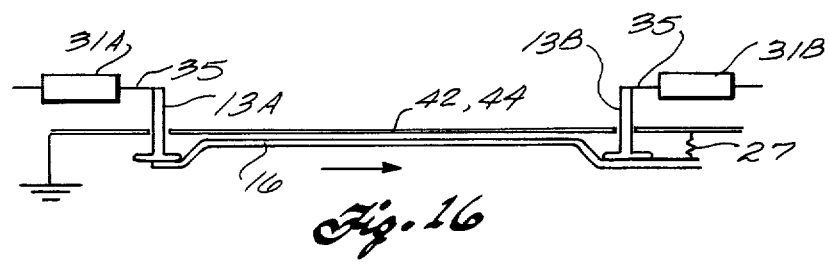
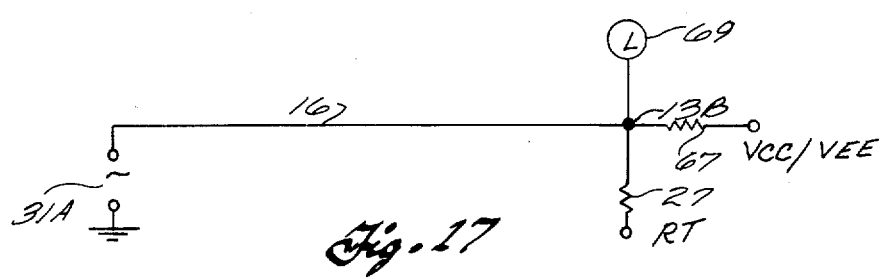

INTEGRATED CIRCUIT MOUNTING BOARD HAVING INTERNAL TERMINATION RESISTORS

BACKGROUND OF THE INVENTION

1. Field of the Invention

This invention pertains to mounting boards for integrated circuit devices and for interconnection thereof. More particularly, it pertains to a logic card for interconnection of high frequency integrated circuit devices with high packing densities on the card and in which transmission line termination devices are defined in the card.

2. Review of the Prior Art

Integrated circuits (ICs) are being developed for operation at faster and faster cycle rates. Typical IC operating rates are now in the range of nanoseconds; one nanosecond in one billionth ($10^{-9}$) second. IC operating rates in the range of picoseconds, i.e., trillionths ($10^{-12}$) of a second, can be expected in the near future.

In the context of this invention, it will be understood that ICs operate as a complex series of switches which switch on or off depending upon whether a signal, or a combination of signals, is or is not present at the inputs to the switches. The signals are digital in that it is the presence or absence of a voltage which is important, not the magnitude of the voltage. Thus, ICs operate on, or in response to signals which shift very rapidly between "signal" and "no signal" states.

The switches and other components of ICs operate at very fast speeds. In a good conductor which does not create delays in signal propagation, electrical impulses travel at speeds approaching the speed of light; IC circuit components operate at comparable speeds. A principal practical limitation on the speed of an IC is how far a signal has to travel, within the IC, at the speed of light. The astounding speed of ICs is due to their very compact nature, such that the distances signals must travel between circuit components is very very small. The stimulus to keep inter-component distances very small has led to the development of medium scale integrated circuits (MSIs) and large scale integrated circuits (LSIs); some examples of the latter have an area measured in square inches, whereas ICs have effective areas measured in small fractions of a square inch.

Regardless of its size, any IC is a device which performs only the functions or logical operations it is specifically designed to do, either as a result of the internal arrangement of the device or as a result of the manner in which connections are made to the device. ICs, regardless of size, involve very precise, complex and costly fabrication procedures. ICs, therefore, are economically feasible, in most instances, only where they can be produced in quantity. There are many instances where the high speed operation of ICs is desired, but the number of total devices needed is too low to justify the cost of MSIs or LSIs. As a result, ICs, as distinguished from MSIs and LSIs, are available in a number of configurations (functions) for use as building blocks in the construction of larger logic circuits of limited quantity and specialized nature. Such building blocks are mounted on special circuit boards, commonly called "logic cards", and are interconnected in appropriate manners on the boards to define the overall logic circuits. The individual ICs are mounted on the boards as close together as possible to reduce, to the greatest extent possible, the lengths of the interconnections between the ICs, all so that the interconnection distances do not impose speed limitations on the overall logic circuit.

Heretofore, the ICs used in building block fashion on logic cards did not have operating rates which significantly exceeded the transmission time between individual ICs on a logic card, and the relatively low density at which such ICs were packed or mounted on logic cards was not a serious problem. Recently, however, ICs having very fast operating rates have been developed; emitter coupled logic (ECL) ICs are an example of these new ICs. ECL ICs operate at speeds in the nanosecond range. (For example, Fairchild Semiconductor's F100K ECL ICs have a response time of 0.7 nanoseconds). When ECL ICs are mounted on existing logic cards, two problems are presented. The first problem is that the interconnecting paths between individual ICs is so long that the delays of signal transmission between ICs, simply as a matter of distance, are significant. The second problem is that the signal frequencies (the rate at which the signal voltage shifts from a "no-signal" state to a "signal" state and back) are so high that the interconnections between ICs begin to function as transmission lines, thus giving rise to the subsidiary problems of signal reflection and degradation and of propagation delays, all caused by frequency related impedance mismatches. These problems have been solved, after a fashion, by the mounting on the surface of the logic cards with the ICs of transmission line termination devices, such as resistors or resistor networks. The individual resistors couple the IC leads to the interconnections between ICs and serve as transmission line termination impedances which match the IC impedances to the interconnection impedances; this is done to give increased signal transmission efficiency. Increased transmission efficiency between ICs makes the signals move faster and better. The difficulty which the use of such resistors and resistor networks on logic cards is that they occupy space on the cards. Thus, the several ICs on the cards must be spaced farther apart, and the delays attributable solely to distance remain or are increased. The result is that overall circuits composed of interconnected high speed ICs have net operating rates significantly lower than the operating rates of the component ICs themselves, solely because of the distances which the signals must travel between ICs.

In view of the foregoing, a need exists for improved ways to closely mount high speed ICs on logic cards, thereby to reduce to the greatest extent possible the distances which signals must travel along interconnections between ICs, while still providing compensation for the transmission line effects which arise in such interconnections by virtue of the signal frequencies involved.

SUMMARY OF THE INVENTION

This invention is addressed to the need identified above. This invention provides an improved family of logic cards which are especially useful with high speed ICs, such as ECL ICs. The improved logic cards make it possible to locate the ICs very close together, thereby reducing signal transmission times between ICs. The transmission line termination devices are effectively retained, however, within the interior of the logic cards, not on the exterior of the cards where they previously prevented the ICs from being closely packed together. The termination devices for each IC to be mounted on the card preferably are located in the board within the area covered by the IC when the IC is mounted to the card. As a result, the only limitations on IC packing density on the card are the size of the IC package itself (which packages are usually much larger than the significant operating portions of the ICs), and the clearances needed to enable the ICs to be connected to the card and to enable the desired interconnections to be made.

Generally speaking, this invention provides an improved logic card for interconnection of integrated circuits. The card comprises a laminate for supporting a plurality of integrated circuit devices, each IC device having a plurality of leads extending therefrom. The laminate includes, preferably as an interior component of the laminate, a conductive layer. A selected plurality of holes are formed through the board in selected patterns at each of a plurality of stations on the laminate. At least some of the stations correspond to locations where integrated circuits can be mounted to the card. A conductor is disposed in each of the holes. The conductors in each pattern define first and second groups of conductors. Each of the conductors in the first groups have one end effectively exposed on one side of the laminate, and each of the conductors in the second groups have their opposite ends effectively exposed on opposite sides of the laminate for connection thereto of either a lead from an integrated circuit or an interconnection conductor. Termination means are provided internally of the laminate and are coupled to the in-hole conductors of the first group in each pattern. The termination means are also coupled to the conductive layer and, in effect, define a transmission line device between the conductive layer and each firt group in-hole conductor.

The present invention, broadly summarized above, is useful with ICs in different packaging configurations and with various interconnection techniques. Thus, the invention in one form provides a logic card for the mounting and interconnection of ICs in a dual inline pack (DIP) arrangement in which the IC leads are provided in two parallel rows of leads, the rows being aligned with the elongate edges of flat rectangular bodies of the packs, the leads in the rows being disposed perpendicular to the plane of the body. In another form, the invention provides a card for the mounting and interconnection of ICs in a flat pack arrangement in which the several leads extend parallel to the plane of the flat square or rectangular IC body and from the four edges of the body. The interconnection techniques which may be used with the present cards include "Stitchwire" (a trademark of Moore Dynamics, Inc.) interconnections in either the pinned or pinless board modes and "Wire Wrap" (a trademark of Gardner-Denver Company) interconnections, among others.

DESCRIPTION OF THE DRAWINGS

The above-mentioned and other features of this invention are more fully set forth in the following detailed description of presently preferred embodiments of the invention, which description is set forth with reference to the accompanying drawings, wherein:

FIG. 7 is a plan view, to the same scale as FIGS. 5 and 6, of an internal component layer of the laminated logic card shown in FIGS. 5 and 6;

FIG. 8 is an enlarged view of that portion of the logic card enclosed within broken line 8 in FIG. 5;

FIG. 9 is an enlarged view of the portion of FIG. 6 enclosed within broken line 9;

FIG. 10 is an enlarged view of that portion of FIG. 7 enclosed within broken line 10;

FIG. 11 is a detail of a first-stage etching mask used to define the logic card feature shown in FIG. 10;

FIG. 12 is a second-stage etching mask used to define the feature of the logic card shown in FIG. 10;

FIG. 13 is an etching mask used in connection with the reverse side of the logic card component shown in FIG. 7;

FIG. 14 is a fragmentary enlarged cross-sectional elevation view of a portion of the logic card shown in FIG. 5; FIG. 15 is a fragmentary enlarged cross-sectional elevation view similar to that of FIG. 14 of another portion of the logic card shown in FIG. 5;

FIG. 16 is a simplified partially-schematic representation of a typical Ic interconnection encountered in the exemplary circuit depicted in FIG. 5;

FIG. 17 is a schematic diagram equivalent to the illustration of FIG. 16;

FIG. 18 is an enlarged plan view of a portion of the intermediate laminate of the logic card shown in FIG. 3;

FIG. 19 is a first-stage etching mask useful in the manufacture of the logic card shown in FIG. 3;

FIG. 20 is a second-stage etching mask useful in the manufacture of the logic card shown in FIG. 3;

FIG. 21 is an enlarged cross-sectional elevation view of another logic card according to this invention;

DESCRIPTION OF THE ILLUSTRATED EMBODIMENTS

Figure 1:
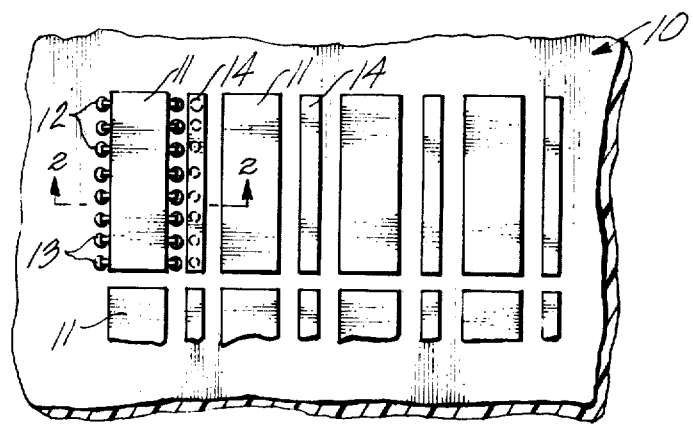
FIG. 1 is a fragmentary plan view of a prior art logic card for mounting 16 pin dual in-line pack (DIP) ICs and plug-in resistor networks.
Figure 2:
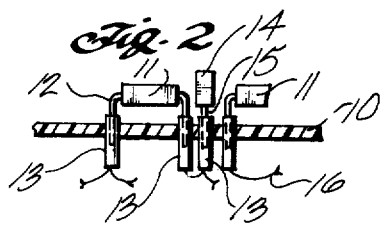
FIG. 2 is a cross-sectional elevation view taken along line 2—2 in FIG. 1.

FIGS. 1 and 2 show a portion of an existing (prior art) logic card 10 to which a plurality of sixteen lead DIP ICs 11 are mounted. ICs 11 are mounted in a four-across array in a predetermined pattern on the card 10; typically the pattern is a 4×5 pattern. The body of the card is defined principally by conventional printed circuit board material, for example. Each IC 11 has eight leads 12 extending from each of the two elongate sides of the IC, the leads being bent as shown in FIG. 2, to be parallel to each other and perpendicular to the basic plane of the generally flat IC package. Each of leads 12 is received in a socket pin 13 which is suitably mounted in card 10 so that the opposite ends of the socketed terminal pins are exposed on opposite sides of the card. In the prior art arrangement shown in FIGS. 1 and 2, a resistor network 14 is disposed adjacent each IC. Each resistor network is in a single in-line (SIP) configuration and has eight leads 15 (see FIG. 2) extending therefrom to be engaged in a corresponding plurality of socketed terminal pins 13. On the side of card 10, opposite from the ICs and the resistor networks, i.e., the rear side of the card, the various terminal pins are appropriately interconnected. In FIG. 2, the interconnections between terminal pins are made by conductors 16, which preferably are connected to the rear ends of the terminal pins by the cold electrode through-insulation welding technique described in U.S. Pat. No. 3,627,970, for example. Circuit interconnections made in accordance with this patent are known as "Stitchweld" interconnections. If desired, the rear ends of terminal pins 13 may be defined to be useful in the making of "Wire Wrap" interconnections, "Wire Wrap" being a trademark of Gardner-Denver Company.

Figure 3:
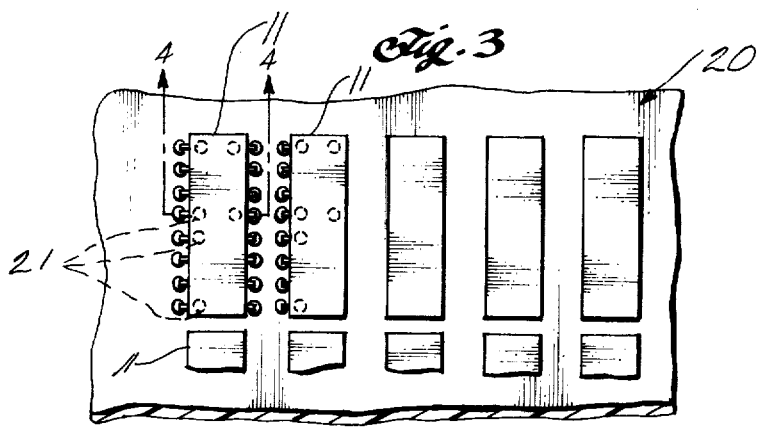
FIG. 3 is a fragmentary cross-sectional elevation view (to the same scale as FIG. 1) of a logic card according to this invention for the mounting of 16 pin DIP ICs.
Figure 4:
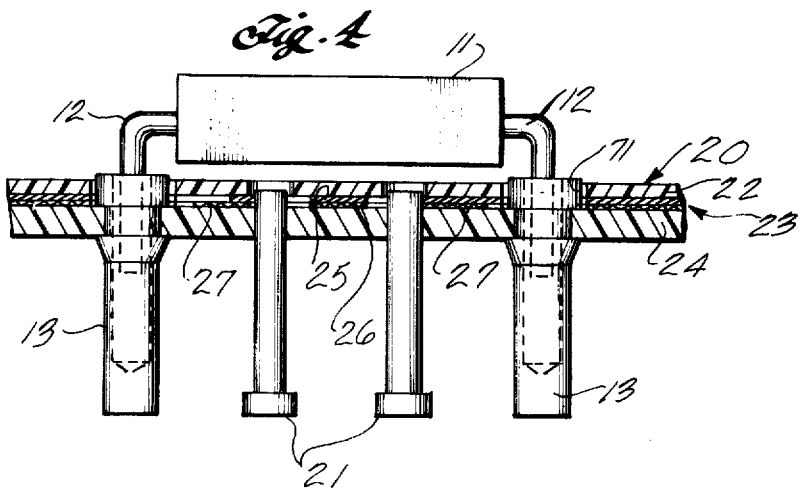
FIG. 4 is an enlarged cross-sectional elevation view taken along line 4—4 in FIG. 3.

FIGS. 3 and 4 pertain to a logic card or board 20 according to the present invention. FIGS. 1 and 3 are drawn to the same scale. It will be observed that five sixteen lead DIP ICs are mounted to card 20 in the same space required to mount four identical ICs 11 on card 10. Thus, card 20, constructed according to this invention, makes it possible to pack ICs 11 on card 20 with a greater density than is the case on card 10. This increased packing density is made possible by the elimination from the surface of card 20 of the resistor networks 14.

FIG. 4 is an enlarged cross-section view taken along line 4—4 in FIG. 3 and, when compared to FIG. 2, shows the principal differences between logic cards 10 and 20. Terminal pins 13 on cards 10 and 20 may be Moore Systems, Inc., Part No. 700508, for example, where the interconnections between the terminal pins are "Stitchweld" interconnections.

As shown in FIG. 4, logic card 20 is characterized particularly by the inclusion of a plurality of terminal pins 21 which are disposed within the group of terminal pins 13 associated with each IC position on the card, and which effectively have only one end thereof exposed to the exterior of the board, i.e., to the rear face of the board, for connection to the pin of an interconnection conductor. The interconnections to be made to terminal pins 21 are to be "Stitchweld" interconnections; terminal pins 21 may be Moore Systems, Inc. Part No. 700506. If desired, the upper ends of the terminal pins 21 may be exposed above the upper surface of logic card 20, but it is not essential to the practice of the present invention that they be so exposed. If "Stitchweld" interconnections are to be made to terminal pins 21 by use of apparatus according to either of U.S. Pat. No. 3,705,970 or 3,860,782, then the upper ends of the pins are accessible to enable such welding apparatus to be used; however, if such interconnections are to be made with welding apparatus according to U.S. Pat. No. 3,596,044 or 3,822,373, then the upper ends of the pins need not be accessible to enable a conductor to be welded to the lower end of any of the pins 21.

It will be observed from FIG. 4 that IC 11 is so engaged with its mounting terminal pins 13 to overlie the upper ends of terminal pins 21.

Logic card 20 is further characterized by being defined as a laminate of discrete component layers which are described in greater detail with reference to logic card 30, for example. Briefly, however, logic card 20 is composed of a top layer 22 which may be defined by a layer of conventional epoxy-glass printed circuit board material, by an intermediate laminated layer 23 and, by a bottom layer 24 which may also be defined of a conventional printed circuit board stock material which normally is a composite of fiberglass and epoxy resin. Intermediate laminated layer 23 is in turn composed of a highly conductive layer 25 which conveniently is copper and of a resistive layer 26. The conductive and resistive layers 25 and 26 are selectively etched away to define a plurality of resistors 27 within the logic card, each resistor being coupled to a respective one of terminal pins 21. As described more clearly below, resistors 27 comprise transmission line termination devices internally of logic card 20.

Figure 5:
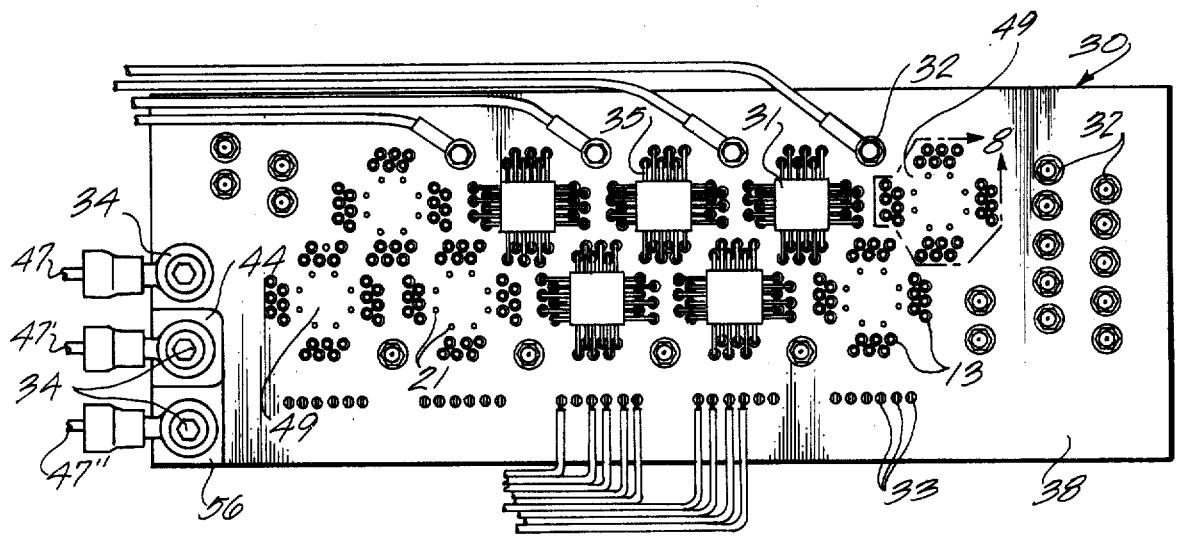
FIG. 5 is an elevation view of another logic card according to this invention useful in the mounting and interconnection of 24 lead flat pack ICs and showing a typical application of the card.
Figure 6:
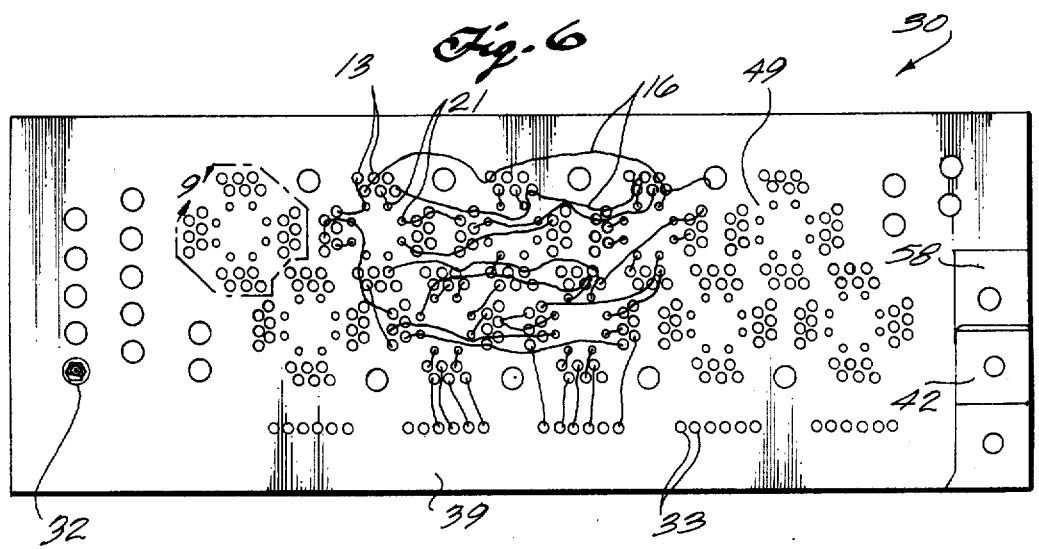
FIG. 6 is an elevation view of the reverse side of the logic card shown in FIG. 5 at an intermediate stage in the manufacture of the circuit illustrated in FIG. 5.

The present invention is described in detail principally with reference to FIGS. 5–17 which relate to logic card 30, the front face of which is shown in an elevation in FIG. 5. Logic card 30 is a ten-station logic card defined to mount up to ten 24-lead flat pack ICs 31. The five ICs 31 shown in FIG. 5 are components of an exemplary circuit defined by use of the logic card. That is, the 5 ICs 31 shown in FIG. 5 are components of a functioning circuit, namely, a 128 bit word generator. Card 30, however, is useful with a variety of circuits. The specific nature of the the circuit defined on the card depends upon the number and type(s) of ICs mounted at the different IC stations on the card, and by the manner in which the ICs are interconnected by interconnection conductors adjacent to the rear face of the card (see FIG. 6). Accordingly, to adapt card 30 for such versatile use, a plurality of coaxial connectors 32 are carried by the card at selected locations and a plurality of bifurcated-end terminal pins 33 are carried by the card at selected other locations. The coaxial connectors 32 are a.c. signal input-output connectors for the card and may be according to MicroDot series 141 or Selectro series 50. Terminal pins 33 are d.c. signal input-output connectors. Logic card 30 is specifically adapted for use with ECL integrated circuits and therefore provides for connection of conductors 47, 47' and 47" to VCC, VEE, and RT layers of the card with No. 6 connection hardware 34. In a presently preferred form of logic card 30, coaxial connectors 32 are 50 ohm connectors.

In the exemplary circuit shown in FIG. 5, ICs 31 preferably are Fairchild Semiconductor F-100 K, Isoplanar II, ECL integrated circuits which are 24 lead devices. These semiconductors are in a flat pack configuration. Six leads 35 extend parallel to the basic plane of the device from each of the four sides of the generally square device package. These leads are connected, as by reflow soldering, to the upper ends of the corresponding ones of a plurality of conductive terminal pins 13 which are carried by the card and have their opposite ends exposed on the opposite sides of the card.

The laminated construction of card 30 is shown best in FIGS. 14 and 15. The overall lamination which defines the body of logic card 30 is composed of upper and lower aluminum layers 36 and 37, respectively, the opposite surfaces of which define the upper and lower surfaces 38 and 39 of the card. In a present preferred form of logic card 30, aluminum layers 36 and 37 are 0.020 inch thick and are hard anodized over selected areas of surfaces 38 and 39, respectively, for the purposes which are described in greater detail below. An intermediate laminate 40 is composed principally of a layer of conventional epoxy-glass printed circuit board material 41 which has a layer of copper or other highly conductive material 42 adhered to its lower surface. The upper surface of layer 41 has adhered to it a thin layer of resistive material 43 over which is adhered a thin layer of copper or other highly conductive material 44. The copper layers 42 and 44 may have a nominal thickness of 0.001 inch. In a presently preferred embodiment of logic card 30, intermediate laminate 40 is obtained from Mica Corporation, 10900 Washington Boulevard, Culver City, California. Specifically, the Mica Corporation markets such laminates under the trade name "Micaply Ohmega", and Mica Corporation's trademark "Ohmega" is pertinent to resistive layer 43. For further details on the resistive layer 43, reference is made to U.S. Pat. Nos. 3,691,007, 3,743,583, and 3,808,576 which are stated by Mica Corporation to be pertinent. Intermediate laminate 40 is adhered between aluminum layers 36 and 37 by upper and lower bonding layers 45 and 46, respectively, which preferably are layers of "H Film" having a thickness of approximately 0.0005 inch.

In logic card 30, upper aluminum layer 36 defines the VEE plane of the card. Lower aluminum layer 37 defines the VCC plane, and conductive layers 42 and 44 of intermediate laminate 40 define the RT plane of the card. Appropriate connections are made by respective ones of conductors 47, 47" and 47' associated with the No. 6 connection hardware 34 shown in FIG. 5.

It was noted above that logic card 30 defines ten IC mounting stations 49. A given one of these mounting stations is developed in detail in FIGS. 8, 9 and 10 to which FIGS. 11, 12, and 13 also pertain. As shown in these figures, a plurality of holes are formed through the card 30 in a selected pattern at each of stations 49; in card 30 the pattern is uniform between the several stations 49 on the card, although it is within the scope of this invention that the hole pattern at one station may be different from the pattern at any other station, if desired.

With reference to FIGS. 8, 9 and 10, the holes at a station 49 are composed of relatively large diameter holes 50 with which the through-card terminal pins 13 are associated, and relatively smaller diameter holes 51 with which terminal pins 21 are associated. A conductor is disposed in each of the holes in each pattern; in the case of holes 50, the conductor is a corresponding one of terminal pins 13, and in the case of holes 51, the conductor is a corresponding one of terminal pins 21. As set forth more fully below, it is within the scope of this invention that the conductors may be plated-through conductors which have appropriate ends exposed to the bottom, or the top and bottom, surfaces of the card as in the case where the interconnections between the in-hole conductors are to be made by a "Stitchweld" interconnection technique using a concentric electrode welding machine as contrasted from an opposed electrode "Stitchweld" machine for which card 30, as illustrated, is specifically adapted.

The conductors disposed in holes 50 and 51 in each pattern comprise first and second groups of conductors in each pattern. Thus, terminal pins 21 disposed in holes 51 are elements of the first group of conductors in pattern 49, and terminal pins 13 in holes 50 are components of the second group of conductors in the pattern. The second group of conductors (terminal pins 13) are disposed in the pattern to surround the conductors (terminal pins 21) of the second group. The conductors in the first group in each pattern (terminal pins 21) are effectively exposed on one side (the bottom side 39) of the card. The conductors in the second group (terminal pins 13) have their opposite ends effectively exposed on opposite sides of the laminated card. Thus, the upper ends of the conductors disposed in the second group of holes 50 are adapted to be connected to corresponding ones of leads 35 from an IC 31 and are adapted at their lower ends adjacent the bottom surface 39 of the card to be connected, as necessary, to an interconnection wire 16. The conductors in the first group, i.e., terminal pins 21 are adapted at their lower ends to be connected to an interconnection wire 16, as necessary, to define the overall circuit desired.

At least one of the second group conductors in each pattern of holes at an IC station 49 makes conductive contact with the top aluminum layer 36 which, as noted above, is the VEE plane of the logic card. With reference to FIGS. 8 and 9, there is one such conductor in each pattern of logic card 30 and this conductor is indicated at 52. Conversely, in each hole pattern, there is at least one conductor disposed in the second group of holes which makes conductive contact with the bottom aluminum layer 37 which, as noted above, is the VCC plane in logic card 30. In logic card 30 there are two such terminal pins and they are indicated in FIGS. 8 and 9 at 53. All other conductors disposed in the holes of the second group in each pattern on logic card 30 make no conductive contact with either of the aluminum layers; they are engaged and supported in the card solely by the epoxy-glass layer 41 which is a component of intermediate laminate 40; this is shown clearly in FIG. 14. Thus, except for terminal pins 52 and 53 in each group of terminal pins 13, these terminal pins are mounted in the logic card to serve as constant impedance feed-throughs from one side of the card to the other. The value of the impedance associated with the constant impedance feed-throughs is the same as or substantially the same as the characteristic impedance of the card. The card's characteristic impedance is determined principally by the connection hardware used to couple the completed logic card into some overall mechanism, i.e., by coaxial connectors 32. In the case of the presently preferred form of logic card 30 shown in FIG. 5, this characteristic impedance is 50 ohms as determined by the use of 50 ohm coaxial connectors 32; the characteristic impedance manifested by "Stitchwire" interconnection wires 16 relative to the VCC plane 37 is approximately 50 ohms; see *High Speed Logic Packaging using Stitchweld Interconnection Technology* by Moore, Owens and Adams, Session 25, 1976 Wescon Professional Program, Western Electronic Show and Convention; Sept. 14–17, 1976, Los Angeles, California. "Stitchwire" is a trademark of Moore Systems, Incorporated, Chatsworth, California.

In order that terminal pins 13, except those specifically identified as 52 and 53, may function as constant impedance feed-throughs in card 30, the laminations of the card on either side of the epoxy-glass layer 41 are drilled out concentric to terminal pins 13 to define annular recesses 54 and 55 (see FIG. 14) which have a selected diameter relative to the diameter of the terminal pins 13 where they pass through these recesses. Epoxy-glass layer 41, on the other hand, is drilled out to mate snugly with the exterior of terminal pins 13 to securely hold these terminal pins in place in the logic card; the preferred configuration of terminal pins 13 is as shown in FIG. 4 rather than in FIGS. 14 and 15 where the structure of the terminal pins is simplified for the purposes of illustration. The pins which function as constant impedance feed-throughs in logic card 30 are also referred to as interconnect pins on the logic card in that they are provided to enable other pins at the same IC station or pins of other IC stations to be connected to them by the interconnection wire 16.

The impedance defined between each interconnect pin 13 and the aluminum layers 36 and 37 of logic card 30 is described by the expression $Z_o \approx K(D_1/D_2)$ where $Z_o$ is the impedance, K is the relevant dielectric constant, $D_1$ is the diameter of recesses 54 and 55, and $D_2$ is the diameter of terminal pin 13 in recesses 54 and 55. The diameter of recesses 54 and 55 is selected relative to the diameter of terminal pins 13, in combination with the value of the pertinent dielectric constant, so that, in a presently preferred logic card 30 the characteristic impedance which exists across the recesses between terminal pins 13 and aluminum layers 36 and 37 is approximately 50 ohms. That is, this impedance is matched to the characteristic impedance of the card as defined principally by coaxial connnectors 32.

FIG. 15 shows the mounting of a VEE pin 52 in logic card 30; it will be understood that the mounting of VCC pins 53 to the card is similar to that shown in FIG. 15 but with respect to aluminum layer 36 rather than aluminum layer 36. Each VEE pin is conductively engaged with and supported by the VEE plane of logic card 30, i.e., upper aluminum layer 36. The remaining constituents of the overall lamination are drilled out concentric to the VEE pin, as shown in FIG. 15, to define recess 57 concentric to the pin. It was mentioned above that the upper and lower faces 38 and 39 of logic card 30 are selectively hard anodized. Upon exposure of bare aluminum to air, it rapidly oxidizes. Aluminum oxide is an electric insulator. Anodization is a process by which aluminum, for example, is caused to oxidize in a known and stable manner. The upper surface 38 of the card is hard anodized over its entire surface, after initial drilling of the holes for terminal pins 21, 13, 33 and for coaxial connectors 32, except in a corner thereof at 56 (see FIG. 5) where conductor lead 47" is connected to the card to apply an appropriate bias voltage to the VEE plane of the card. Shortly before the insertion of the VEE and VCC pins 52 and 53 into the completed laminated construction, the holes into which these pins are to be inserted are drilled out to the finished diameters, and the VCC and VEE pins are then force fitted into the corresponding holes. As the pins are force fitted into these holes, the pins strip off any oxide layer which may have formed in the walls of the holes and make sound electrical contact with the corresponding aluminum layers in which they are supported.

FIG. 10 is an enlarged top view of IC station 49 as defined by intermediate laminate 40. It was noted above with reference to FIG. 4 that each of terminal pins 21 has coupled to it, internally of the card, a transmission line termination device which, in the case of logic card 30, is a resistance 27. Resistances 27, as depicted in FIG. 10, are defined in intermediate laminate 40 by use of first and second stage etching masks 59 and 60 which are shown in FIGS. 11 and 12, respectively. FIG. 7 is an overall top plan view of intermediate laminate 40 as preliminarily drilled prior to assembly of the intermediate laminate into the overall lamination.

First stage etching mask 59, a single station portion of which is shown in FIG. 11, is defined for etching of both conductive layer 44 and resistive layer 43 of intermediate laminate 40 in areas 61 around each of terminal pins 13, including VEE and VCC terminal pins 52 and 53, and also in an area 62 surrounding the locations of terminal pins 21. Area 62 is configured in such manner that following the first stage of the etching process, an arm 63 (comprised of both of layers 43 and 44) extends from around each hole 51 to the major unetched portion of the conductive and the resistive layers outside of the area. The second stage etching mask is essentially identical to the first stage mask, except as shown in FIG. 2, a break 66 is provided in each of arms 63 between the location of hole 51 and the portion of conductive layer 44 which was not removed in the first stage of the etching process. The second stage mask is for etching only the conductive layer 44 but not the resist material 43. Appropriate etching solutions for etching both conductive and resistive layers 44 and 43, or for etching only the conductive layer 44, are available from Mica Corporation. Accordingly, when intermediate laminate 40 is selectively etched, first by use of first stage mask 59 and an etching material effective upon both conductive layer 44 and resistive layer 43, and then by use of second stage mask 60 and an etching material effective only upon conductive layer 44, there results (as shown in FIG. 10) a link via resistive layer 43 between a conductive pad 64 around each hole 51 and conductive layer 44. These links via resistive layer 43 define resistors 27. In a presently preferred embodiment of logic card 30, resistors 27 are defined to have an impedance of 50 ohms.

FIG. 13 is a view of a portion of a mask 65 for an IC station 49 and is useful to etch away the conductive layer 42 on the bottom of intermediate laminate 40. Mask 65 is defined so that the conductive layer 42 is removed from the underside of the intermediate laminate in an area which encompasses all of the terminal pin mounting holes for the station.

Terminal pins 21 are inserted into logic card 30 so as to make conductive contact with the terminal pads 64 of resistors 27. Thus, each of terminal pins 21 is coupled to the major portion of conductive layer 44 only by a corresponding one of resistors 27.

FIG. 16 is a semi-schematic representation of the connection between two interconnection terminals 13 at two different IC stations 49 and on logic card 30 by a "Stitchweld" interconnection wire 16. In FIG. 16, two ICs 31A and 31B are represented. IC 31A is a transmitter, i.e., a generator of a signal which is to be conducted to receiving IC 31B by interconnection wire 16. As noted above, at the frequencies at which ECL ICs operate, interconnection wire 16 would normally present transmission line problems, i.e., problems of signal reflection from terminal 13B back down the interconnection wire toward terminal 13A and problems of signal degradation as a result. It was also noted above that where the interconnection is made by a "Stitchweld" interconnection process, the characteristic impedance of the interconnection wire, by virtue of its parallel proximity to the adjacent aluminum layer of the logic card, is approximately 50 ohms. For efficient transmission of a signal from IC 31A to IC 31B, via terminals 13A and 13B, it is important that the impedance of the receiving terminal 13B be matched to that of the interconnection line itself. As apparent from the foregoing description, this matching of the impedance of interconnection terminal 13B to the impedance of the interconnection line 16 is accomplished by connecting the interconnection line both to terminal 13B and to one of terminals 21 below IC 31B. Thus, at the station of IC 31B, the interconnection line is connected both to interconnection terminal 13B and to a resistor 27 which has a value equal to that of the interconnection line impedance. An efficient transmission line thereby is provided between terminals 13A and 13B, and the desired signal is transmitted effectively and efficiently with minimum degradation and propagation delay, to terminal 13b.

FIG. 17 is a schematic diagram which is equivalent to the semi-schematic diagram of FIG. 16. In FIG. 17, receiving IC 31B is represented by load 69 connected to terminal 13B to which impedance matching resistor 27 is connected and to which an impedance 67 is also effectively connected. Resistance 67 represents the impedance of the constant impedance feed-through associated with interconnection pin 13B. As shown in FIG. 17, resistance 67 is effectively coupled between pin 13B and the VCC and VEE planes of the card, whereas impedance matching resistance 27 is effectively coupled between interconnection pin 13B and the RT plane defined internally of logic card 30 by conductive layers 42 and 44. It will be appreciated that it is desirable that the effective values of impedances 27 and 67 be matched to each other. As seen by the foregoing description, this is the case in logic card 30.

In logic card 30, the ten IC stations 49 occupy an area five inches long by one and one-half inches wide, or an area of 0.75 square inch per IC. (In another form of this invention related to card 30, 144 24-lead ECL flat-pack ICs are mounted in an area measuring 4.25 inches by 12.5 inches; this is a packing density of 0.368 in.$^2$ per IC.) It will also be observed that the individual IC stations are packed together very closely. This high packing density of ICs on logic card 30 means that minimum time is required for a signal to move from one IC station to another, thereby making it possible for the overall circuit (of which the individual ICs are components) to function at operational rates corresponding to the operational rates of the individual ICs. This high packing density of IC stations on logic card 30 is made possible by defining the interconnection line transmission line termination devices (i.e., impedance matching resistors 27) for interconnection lines 16 within the interior of the card itself at locations immediately below the corresponding ICs themselves.

Aluminum layers 36 and 37 are provided as principal components of logic card 30, both to provide VEE and VCC conductor buses within the logic card, and also to serve as heat sinks for the absorption and dissipation of heat generated during operation of the ICs 31. Accordingly, the necessary heat sinks are defined by the logic card itself, rather than by additional space-consuming elements or structures added to the logic cards. The provision of integral heat sinks are in logic card 30 makes it possible for the logic card itself to dissipate approximately one watt of thermal energy per IC. As a result, the ICs may be operated safely at their maximum ratings.

The inclusion of conductive layer 42 in logic card 30 is optional. The inclusion of two conductive layers in intermediate laminate 40 is preferred to give versatility to the logic card.

The lower surface 39 of logic card 30 is hard anodized over its entire surface except in an area 58 (see FIG. 6) to enable connector wire 47 to effectively be connected to the VCC plane by connector hardware 34.

It was noted above that logic card 20, shown in FIGS. 3 and 4, is constructed according to this invention. The basic constituents of the lamination defining card 20 was described in detail with reference to FIG. 4. FIG. 18 is a top plan view of a portion of intermediate laminate 23 of card 20 which encompasses a single station 70 for an IC on card 20 and also end portions of two adjacent stations. FIG. 18 shows the intermediate laminate in its finished state ready for assembly with layer 22 and after preliminary drilling of the intermediate laminate. FIGS. 19 and 20are views of portions of first and second stage etching masks 75 and 76 corresponding to the portion of intermediate laminate 23 shown in FIG. 18; these masks are useful in making the intermediate laminate as shown in FIG. 18. It will be recalled that logic card 20 is defined to mount 16-lead dual in-line pack (DIP) ICs 11, as compared to logic card 30 (see FIG. 5, for example) which is arranged to mount 24-lead flat pack ICs.

In FIG. 18, circles 71 correspond to the areas in which the conductive layer 25 and resistive layer 26 of intermediate laminate 23 are removed from the upper surface of the intermediate laminate concentric to the locations of interconnection terminal pins 13 as shown in FIG. 4. In FIG. 18, points 72 represent the locations at which holes will ultimately be drilled through the intermediate laminate for mounting of terminal pins 21. There are six terminal pins 21 at each station 70 on card 20. Five of these six terminal pins have associated with them resistors 27 defined solely by resistive layer 26, whereas the sixth terminal pin in each group of terminal pins 21 has associated with it a resistor 73 also defined solely by layer 26) having a different configuration, and thus a different inherent resistance, than the resistors 27.

The first-stage etching mask 75 and the second-stage etching mask 76 shown in FIGS. 19 and 20, respectively, are useful in processing a Micaply Ohmega laminate, for example, to the finished state thereof. Mask 75 is useful to define the areas on the basic stock intermediate laminate at which both conductive layer 25 and resistive layer 26 will be etched away by a suitable etching solutiion. Mask 76 is useful to define those areas on the intermediate on which only conductive layer 25 will be etched away, thereby to define resistors 27 and 73 at each IC station 70. In view of the preceding description of FIGS. 11 and 12 to which FIGS. 19 and 20, respectively, are similar, masks 75 and 76 are not described further in detail. It will be apparent, however, that at each IC station 70 on finished logic card 20, each of terminal pins 21 has connected to it a respective one of resistors 27 or 73, which resistors serve as transmission line termination devices to facilitate efficient interconnection of selected ones of the interconnection terminals 13 at different IC stations on the card; in this regard the preceding description presented with reference to FIGS. 16 and 17 is pertinent.

FIG. 21 is an enlarged cross-sectional elevation view of another logic card 80 according to this invention; FIGS. 22-27 are also pertinent to logic card 80. The laminated construction of card 80 is very similar to that of card 20 except that the upper and lower surfaces 81 and 82 of card 80 are defined by conductive layers 83 and 84 whereas such layers are not present in the lamination comprising card 20. As made more clear from the content of FIGS. 22-27, logic card 80 is arranged for the mounting and interconnection of 24 pin dual in-line pack ICs which may be and preferably are DIP configurations of the flat-pack ECL ICs 31 described above with reference to FIG. 5 et seq. In logic card 80, conductive layer 83 defines a VEE plane of the card, whereas conductive layer 84 defines a VCC plane. Each of ICs 85 is mounted to card 80 at a corresponding one of a plurality of IC mounting stations 86, two of which are shown in each of FIGS. 22-27 with portions of adjacent stations. FIGS. 22-27 illustrates the extremely close parking density of the twenty-four lead DIP ICs 85 on card 80.

As shown more clearly in FIG. 21, card 80 is composed of a lamination comprised of an intermediate laminate 87 which may be fabricated of the same intermediate laminate stock material used to define intermediate laminate 40 of logic card 30. The lamination of card 80 also includes a layer of epoxy-glass printed circuit substrate material 88 which carries a conductive layer 83 on its upper surface and which is adhered to the upper surface of intermediate laminate 87 by a suitable bonding layer, not shown. Intermediate laminate 87 of card 80 is composed of a basic structural substrate 89 (defined by a layer of epoxy glass printed circuit board material) having adhered to its lower surface a conductive layer 82, and having adhered to its upper surface a layer of resistive material (preferably a layer of Mica Corporation Ohmega resistive material) over which is laid a layer of conductive material 91 such as copper.

Each IC 85 may be a Fairchild Semiconductor 24-pin DIP configuration of an F100K Isoplanar II ECL integrated circuit. In other words, the basic semiconductor chip which constitutes the actual integrated circuits is the same in both of integrated circuit devices 31 and 85. The packaging of this chip is different as between devices 31 and 85 in that IC device 31 is a flat-pack packaging configuration whereas IC device 85 is a DIP packaging configuration and is of substantially greater overall size than the flat-pack configuration.

It will be recognized at this point in this description that a logic card according to this invention is charcterized by the inclusion, within the logic card, of transmission line termination devices in conductive association with the conductors disposed in the first of two groups of holes through the logic card at each IC mounting station. The conductors disposed in the second group of holes at each IC mounting station are provided for interconnection of the IC input-output leads in the manner described above. Accordingly, at each IC station 86 on card 80 (see FIG. 22, for example), there are two parallel rows of interconnection terminals 13. These rows are spaced upon centers equal to the center-to-center distance between the parallel portions of the leads extending from the opposite elongate edges of a DIP IC 85. Between these two rows of interconnection terminal pins 13, there are two rows of terminal pins 21, there being six terminal pins 21 in each row. Accordingly, at each IC station 86 there are two rows of twelve terminal pins 13 between which are located two rows of six terminal pins 21, the thirty-six terminal pins each disposed in a corresponding hole through the logic card.

Because IC 85 preferably is an F100K ECL IC, it is necessary that VEE and VCC bias voltages be applied to pertinent ones of the IC leads 12. One of terminal pins 13, referenced at 93 in FIG. 21, is a VEE terminal and two of the interconnection terminal pins (see 94 in FIG. 21) are used as VCC terminals. All other interconnection terminal pins 13 at each IC station 86 contact only the epoxy glass layer 89 of intermediate laminate 87 and define constant impedance feed-throughs in logic card 80 in the manner described above. As shown in FIG. 21, the VEE terminal 93 is disposed in intimate conductive contact at its upper end with conductive layer 83 at the top of the card lamination. Each of terminal pins 94 is in intimate conductive contact with conductive layer 84 on the lower side of the card, which layer is used as the VCC plane of the card.

Figure 22:
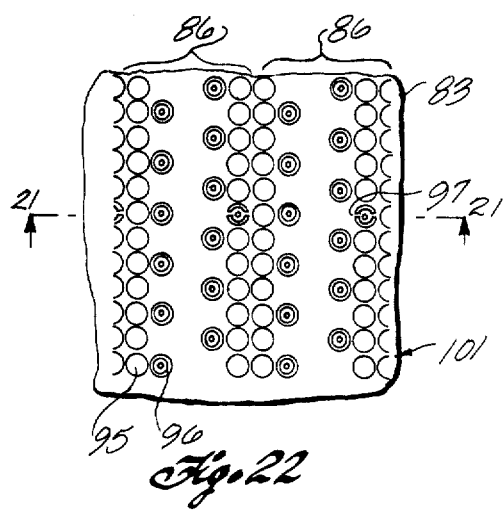
FIG. 22 is a view of a front face etching mask useful in making the logic card shown in FIG. 21.
Figure 23:
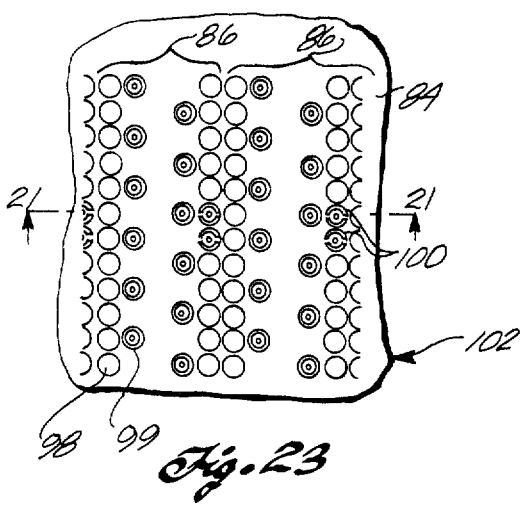
FIG. 23 is a view of a rear face etching mask useful the logic card shown in FIG. 21.

FIG. 22 is a view of a two-station portion of an etching mask used in the manufacture of card 80 to define the precise pattern of conductive layer 83 on insulative layer 88. In FIG. 22, circles 95 define the area in which upper conductive layer 83 is removed concentric to the upper end of each of the terminal pins 13. Circles 96 show how the upper conductive layer is removed around each of the terminal pins 21. At 97, in FIG. 22, is shown the way in which a conductive interconnection is provided between the upper end of a VEE terminal pin 93 and conductive layer 83. FIG. 23, on the other hand, is an etching mask pertinent to lower conductive layer 84; circles 98 and 99 correspond to circles 96 and 96 of FIG. 22. At 100 in FIG. 23 is shown the way in which conductive layer 84 is used to define a conductive connection of conductive layer 84 to each of VCC terminal pins 94.

Figure 24:
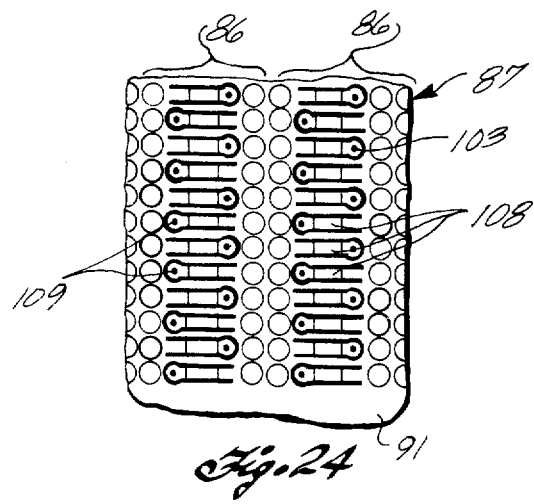
FIG. 24 is a top plan view of a finished intermediate laminate for the logic card shown in FIG. 21.
Figure 25:
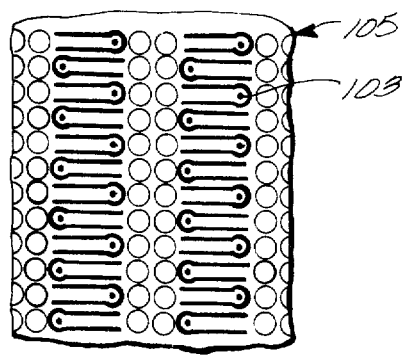
FIG. 25 is a first-stage etching mask useful in the manufacture of the intermediate laminate shown in FIG. 24.
Figure 26:
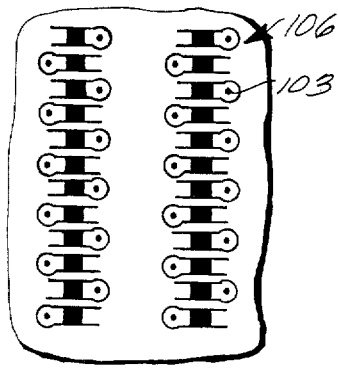
FIG. 26 is a second-stage etching mask useful in the manufacture of the intermediate laminate shown in FIG. 24.

FIG. 24 is a top plan view of a two-station portion of intermediate laminate 87 after first- and second-stage etching thereof. In each of FIGS. 24, 25, and 26, points 103 indicate the locations at which the intermediate layer will be drilled for receipt of terminal pins 21. FIGS. 25 and 26 are portions of first- and second-stage masks 105 and 106, respectively, useful in the manufacture of intermediate laminate 87 as shown in FIG. 24. Mask 105 defines the areas in which both conductive layer 91 and resistive layer 90 will be removed from substrate 89 by a first-stage etching step. Mask 106 defines the areas in which only conductive layer 91 will be removed from the intermediate laminate after conclusion of the first etching step. From the content of FIGS. 24, 25, and 26 it will be apparent that, as assembled into the overall lamination defining the card 80, the intermediate laminate defines (at each IC station 86) twelve resistors 108 interconnecting a pad 109 defined by conductive layer 91 around the location 103 of each terminal pin 21. The other end of each resistor 108 is connected to conductive layer 91 which, in the completed logic card, defines the RT plane of the card; see the preceding description of card 30.

It was noted above that a DIP configuration of a Fairchild Semiconductor F100K ECL integrated circuit is substantially larger than a flat-pack configuration of the same integrated circuit. As a result, each DIP IC 85 occupies a larger area on the surface of logic card 80 than is occupied by the first pack form of the same basic integrated circuit on the surface of logic card 30. The result is that the DIP packaging of the basic IC chip is better able to radiate heat generated by the IC chip during use. Accordingly, the VCC and VEE planes of logic card 80 may be defined of thin layers of copper having a thickness of 0.001 inch. In card 80 the VEE and VCC planes are not relied upon to also serve as heat sinks; the heat generated by an IC 85 is adequately dissipated by the IC package itself. In card 30, however, the heat generated by an IC 31 cannot be radiated by the IC package itself: therefore aluminum layers are used to serve both as the VEE and VCC planes and as heat sinks for coping with the thermal output of the ICs.

In an exemplary form of card 80, 216 CIP ICs 85 are mounted in an area of 96 square inches. This is a packing density of 0.444 in.$^2$ per IC.

In the preceding description of the illustrated embodiments of this invention, the term "transmission line termination device" has been used at times with reference to the impedance matching resistors associated with each of terminal pins 21 at the several IC stations on the different logic cards shown in the drawings. This term has been used because a resistor is not the sole electrical device which may be used in conjunction with terminal pins 21 to assure that the signal generated by one IC is effectively received at an input terminal of a different receiving IC. Another device which may be used in association with terminal pins 21 as a transmission line termination device is a tunnel diode. Such use of a tunnel diode as a component of a transmission line termination device is shown in FIGS. 27-30.

Figure 27:
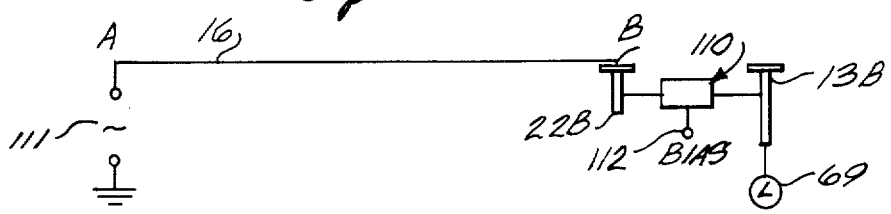
FIG. 27 is a semi-schematic diagram of an arrangement in which a tunnel diode is used as a transmission line termination device.

As illustrated in FIG. 27, which is organizationally similar to FIG. 17, a transmission line device (TLTD) 110, which includes a tunnel diode, has its output connected to a receiving terminal 13B to which is also connected a load 69 which represents a receiving IC which can be any of ICs 11, 31, or 85 according to the preceding description. A signal is to be conducted to load 69 via an interconnection wire 16 from a signal generator 111 which represents a transmitting IC (which may be any of ICs 11, 31, or 85, as desired) at a transmitting IC station A. TLTD 110 has its input connected to a terminal 22B at a receiving IC station B where load 69 and terminal 13B are also located. Wire 16 is connected to station B via terminal 22B so that TLTD 110 connected in series with the interconnection wire at the receiving station B. The TLTD preferably is a small circuit or network which may include a DC blocking capacitor and other appropriate components depending on frequency of operation, in addition to a tunnel diode. The TLTD has a bias terminal 112 which may be defined by conductive layer 42 of a logic card according to this invention resembling logic card 30; the TLTD is defined in the card in conjunction with conductive layer 44. The connections of the TLTD to terminal pins 133 and 22B are made within the card.

A tunnel diode is an electrical device which is either fully conducting, or fully non-conducting, depending upon the nature of things sensed by the tunnel diode. A tunnel diode is very sensitive to changing conditions at its output. A tunnel diode switches very rapidly from a non-conducting to a fully conducting, or from a fully conducting to a non-conducting state, as it discerns a change of state. Specifically, the tunnel diode within TLTD 110 is selected so that it switches from a non-conducting state to a conducting state as soon as it senses a slight change at terminal 22B from a no-signal state to a slight signal state. The tunnel diode switches from a conducting state to a non-conducting state as soon as it begins to see, at terminal 22B, a decrease in the magnitude of the signal applied to terminal 22B via interconnection wire 16. In the arrangement shown in FIG. 27, no attempt is made to match the impedance of terminals 13B and/or 22B to the impedance of interconnection wire 16 considered as a transmission line. The effect upon load 69, however, is as though an impedance matching resistor, having a value equal to the impedance of interconnection wire 16 considered as a transmission line, were in fact coupled to terminal 13B.

Figure 28:
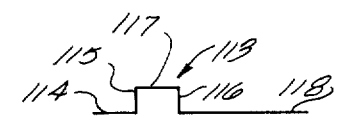
FIGS. 28, 29 and 30 are waveforms descriptive of the signals encountered at pertinent locations in the schematic diagram of FIG. 27, and together show how a tunnel diode operates in a transmission line termination device in a circuit board according to this invention.
Figure 29:
Figure 30:
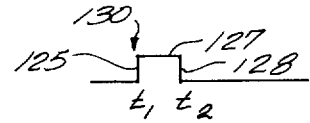

FIGS. 28, 29, and 30 depict the operation of the circuit shown in FIG. 27 at different points in the circuit at corresponding times $t_1$ and $t_2$. FIG. 28 illustrates a signal pulse 113 as generated by signal generator 111 at IC station A. Pulse 113 is a square wave pulse having an initial no-signal value at 114, a rise excursion 115, and a fall excursion 116, between which the signal has a constant value peak at 117; a no-signal value 118 follows the fall excursion. FIG. 29 shows a substantially sinusoidal waveform existing between no-signal states 121 and 122. Waveform 120 represents the nature of square pulse signal 113 as delivered by interconnection line 116 to terminal 22B. Because no attempt is made to match the impedance of the receiving terminal to the effective impedance of interconnection line 16, the transmission of square wave pulse signal 113 to station B is not efficiently accomplished by the interconnection wire 16. The result is that the sharply defined square wave pulse 113 originated by signal generator 111 is degraded into the rounded waveform 120 as this signal reaches station B.

TLTD 110 is defined to apply to terminal 13B a voltage which corresponds to the value of generated pulse 113 at peak 117, and to do so at appropriate times. As generated pulse 113 is received at terminal 22B in the degraded form shown by waveform 120, the initial increment of degraded pulse 120 above the no-signal state 121 is sensed by the tunnel diode with TLTD 110. That is, the initial rise 123 of waveform 120 is sensed at time $t_1$ by the tunnel diode, thereby rendering the tunnel diode fully conductive. Accordingly, the voltage applied to the TLTD at its bias terminal 112 is immediately and appropriately passed to terminal 13B and to load 69; this is represented at 125 in FIG. 30 which depicts the change of TLTD 110 from a non-conducting to a fully conducting state. The tunnel diode and the TLTD remain fully conducting as the magnitude of the signal applied via interconnection wire 16 to terminal 22B continues to increase to a maximum at 126, see FIG. 29, at time $t_2$. The fact that the tunnel diode is fully conducting between times $t_1$ and $t_2$ is represented at 127 in FIG. 30. However, at time $t_2$ the value of the signal applied to terminal 22B via interconnection wire 16 begins to decrease as waveform 120 passes its maximum 126. This is a sensible change of state in wave-form 120 which is detected by the tunnel diode as a significant change in the state of things at terminal 22B. Accordingly, the tunnel diode switches from its conductive state to its non-conductive state; this is represented at 128 in FIG. 30 at time $t_2$. Thereafter, the tunnel diode and the TLTD remain nonconducting until there is sensed the initial rise portion of another degraded pulse applied to terminal 22B by interconnection wire 16 from signal generator 111.

From an examination of FIG. 30, it will be apparent that the effect of TLTD 110 is to regenerate at terminal 13B for application to load 69, a new square wave pulse 130. Such regeneration occurs essentially in step with generated pulse 113. The pulse generation occurs in response to the application to terminal 22B of a degraded form of generated pulse 113. Thus, the effect upon load 69 is the same as though terminal 13B were fully impedance matched to interconnection line 16. While TLTD 110 operates according to totally different principles than does resistor 27 in FIG. 17, the effect upon load 69 is the same. Accordingly, the term "transmission line termination device" is used as descriptive of both resistor 27 (see FIG. 17) and the arrangement 110 which includes a tunnel diode, as well as with reference to any other electrical device which would have the same effect upon load 69.

In the preceding description of FIGS. 27-30, it has been assumed that pulse 130 is generated at terminal 13B precisely in synchronism with the generation of pulse 113 by signal generator 111. It will be appreciated that some slight delay will occur between the generation of pulses 113 and 130 due to the fact that the signal generator and the receiving terminal are separated in space; some discrete time is required for generated pulse 113 to be manifested in degraded form at receiving station B. This time lag, however, is extremely short, and for the purposes of the preceding description has been assumed not to exist.

Tunnel diodes are relatively simple semiconductor devices which can be defined in a very compact area. Persons skilled in the art to which this invention pertains will appreciate that an array of tunnel diode TLTDs, with appropriate other circuit components, can readily be defined in an intermediate layer of a laminated logic card according to this invention at locations in the cards corresponding to the locations of the internal impedance matching resistors described above. Such terminal diode TLTDs can be fabricated by use of thin film semiconductor deposition technology in the manner in which such technology is used to fabricate microelectronic circuits; see *Scientific American*, Sept., 1977.

In view of the foregoing description, it will be appreciated that this invention effectively satisfies the need to which the invention is addressed. That is, this invention provides significantly improved ways to closely mount high speed ICs on logic cards, thereby to significantly reduce the distances which signals must travel along interconnections between ICs. Simultaneously, this invention provides compensation for the transmission line effects which arise in such interconnections by virtue of the very high signal frequencies which are involved in high speed ICs. Because the transmission line termination devices are contained within the interior of the logic cards themselves, they do not occupy space on the surface of the card. This makes it possible for the ICs to be mounted substantially closer together than heretofore possible. Also, because the transmission line termination devices are within the logic cards, they are protected from hazard during handling of the logic cards as the ICs are mounted to the card and as desired interconnections are made between the various interconnection terminals of the card. Further, because the transmission line termination devices are within the card, the desired ultimate circuitry can be defined more quickly on the board than in the case where external resistor networks are also handled, positioned and connected. The cards are of standardized configuration but are useful to define myriad different arrangements depending upon the number and types of ICs used and the manner in which the different ICs are interconnected externally of the card. Because the cards are of a standardized construction, they may be manufactured efficiently and considerably more economically than multi-layer printed circuit cards and the like which are, in effect, special purpose cards defining the desired interconnections therein. Multi-layer printed circuit cards are of considerably restricted utility and versatility as compared to logic cards of the present invention.

The preceding description of this invention has been presented with reference to presently preferred embodiments of the invention. Workers skilled in the art to which this invention pertains will recognize that other logic cards and configurations thereof are possible within the basic teachings of this invention. Accordingly, the preceding description, presented principally with reference to presently preferred forms of the invention but certainly not all possible forms of the invention, should not be regarded as exhaustive and restrictive of the scope of the present invention.

What is claimed is:

1. A logic card for mounting of integrated circuit devices thereto and for selective interconnection of mounted integrated circuit devices, the card comprising
   (1) a laminate which includes a relatively highly conducting layer,
   (2) a plurality of conductors carried by the laminate at each of a plurality of integrated circuit device mounting stations defined on one of two opposite sides of the laminate, the conductors comprising a first group of termination conductors and a second group of mounting conductors at each station,
      (a) the mounting conductors at each station being effectively exposed on the opposite sides of the laminate and disposed out of contact with the conductive layer, the mounting conductors at each station being disposed to define substantially the boundary of the station and disposed in a selected pattern corresponding to the arrangement and relative spacing of a corresponding plurality of conductive leads from an integrated circuit device of specified external configuration, whereby an integrated circuit device of appropriate configuration can be mounted to the card at the station by connection of the leads thereof to the station's mounting conductors adjacent the one side of the laminate,
      (b) the termination conductors at each station being disposed inwardly of the station's mounting conductors relative to the center of the station and effectively exposed at least on the other side of the laminate,
   (3) a plurality of separate means at each station each defining a transmission line termination device, the number of said separate means at each station being equal to the number of termination conductors at the station, each said separate means being carried by the laminate as a part thereof within the boundary of the corresponding station, and means conductively connecting each of said separate means at each station to the laminate conductive layer and to a respective one of the termination conductors, whereby an integrated circuit device mounted at one station adjacent the one side of the laminate can be connected to receive a signal from another device similarly mounted at another station by a conductor disposed adjacent the opposite side of the laminate and connected (a) between selected ones of the second group conductors at each of the two stations and (b) to any one of the first group conductors at the one station, and (4) connection means conductively connected to the laminate conductive layer and accessible to the exterior of the laminate at a selected location on the card adapting the card for application of a selected potential to the laminate conductive layer.

2. A logic card according to claim 1 wherein the mounting conductors at each station are arranged adjacent the other side of the laminate for the connection thereto of an insulated unshielded wire in essentially a common plane parallel to said other side of the laminate and for routing of the wire essentially in said plane to another second group conductor, whereby all such wires as may be connected between mounting conductors are disposable in essentially a common plane adjacent the other side of the laminate to have a characteristic impedance relative to the laminate between the mounting conductors, and wherein the transmission line termination devices at the several stations have an impedance substantially equal to said characteristic impedance.

3. A logic card according to claim 1 wherein the transmission line termination device comprise resistors.

4. A logic card according to claim 1 wherein the transmission line termination devices comprise tunnel diodes.

5. A logic card according to claim 1 wherein the conductors comprise terminal pins carried by the laminate and extending from the other side and from the opposite sides of the laminate.

6. A logic card according to claim 1 wherein the laminate includes a second relatively highly conductive layer separated from the first conductive layer by a non-conductive layer, and wherein selected ones of the mounting conductors are conductively coupled to the second conductive layer.

7. A logic card according to claim 6 wherein the second conductive layer defines an exterior surface of the laminate and is defined of a material which is both electrically and thermally conductive and is sufficiently thick relative to the first conductive layer to function in use as a heat sink relative to integrated circuit devices mounted to the card at said stations.

8. A logic card according to claim 7 wherein said exterior surface of the laminate is on the side thereof and the second conductive layer is defined of aluminum.

9. A logic card according to claim 6 wherein the laminate includes a third conductive layer separated from the first conductive layer by a second non-conductive layer, and wherein selected different ones of the mounting conductors are conductively coupled to the third conductive layer.

10. A logic card according to claim 9 wherein the third conductive layer defines the other exterior surface of the laminate and is defined of a material which is both electrically and thermally conductive and is sufficiently thick relative to the first conductive layer to function in use as a heat sink.

11. A logic card according to claim 9 wherein the total number of the selected ones and the different selected ones of the mounting conductors in each pattern is less than the total number of the mounting conductors in each pattern, and wherein the remaining mounting conductors are disposed out of contact with all of the conductive layers.

12. A logic card according to claim 11 wherein the remaining mounting conductors define constant impedance feed-throughs through the laminate.

13. A logic card according to claim 12 wherein the transmission line termination devices at the several stations all have a common impedance, and wherein the impedance of each constant impedance feed-through is substantially equal to the impedance of each transmission line termination device.

14. A logic card for selective wired interconnection of integrated circuits comprising 1. a laminate comprising
   (a) a first insulative layer,
   (b) a highly conductive metallic layer,
   (c) a conductive resistance layer in intimate surface-to-surface contact with the metallic layer and having a selected electrical resistance characteristic, and
   (d) a second insulative layer, 2. a selected plurality of holes through the laminate disposed in a selected pattern at each of a plurality of integrated circuit mounting stations on the card, each plurality of holes defining a first group of holes and a second group of holes 3. a conductive pin mounted in each of said holes, the pins in the first group holes comprising termination pins having ends exposed at one side of the laminate and the pins in the second group holes comprising mounting pins having opposite ends exposed at the opposite sides of the laminate, the mounting pins defining substantially the boundary of the corresponding station and being adapted at their ends adjacent the other side of the laminate for connection thereto of leads from an integrated circuit device for support of the device adjacent the said other side of the laminate, the termination pins at each station being disposed inwardly from the station boundary, 4. the metallic layer and the resistance layer being spaced sufficiently from the boundaries of the second group holes to be isolated from the mounting pins mounted in said holes, 5. the metallic layer within the boundary of each station being removed from the laminate around each of the holes in each first group according to a first scheme and the resistive layer within each station boundary being removed from the laminate adjacent to each of the holes in each first group according to a second related scheme so that the metallic layer is electrically coupled separately to each of the termination pins by respective separate strips of said resistance layer which define within each station resistors of selected impedance between the termination pins and the metallic layer, and 6. means for connecting a lead only to the highly conductive layer at a selected location on the cards.

15. A logic card according to claim 14 wherein the ends of the termination and mounting pins adjacent the one side of the laminate are disposed in substantially a common plane proximate to and parallel to the laminate and are adapted for connection thereto of a conductor wire by welding.

16. A logic card according to claim 14 wherein the mounting pins at each station are arranged in two parallel spaced rows of equal numbers of pins, and the termination pins at each station are located between said rows.

17. A logic card according to claim 14 wherein the mounting pins at each station are arranged along the four sides of a generally square area, and the termination pins at each station are located in such area.

18. A logic card for selective wired interconnection of integrated circuits comprising
1. a laminate comprising
    (a) a first conductive metallic layer,
    (b) a first insulative layer,
    (c) a second conductive metallic layer,
    (d) a conductive resistance layer in intimate surface-to-surface contact with the second metallic layer and having a selected electrical resistance characteristic,
    (e) a second insulative layer, and
    (f) a third conductive metallic layer,
2. a selected plurality of holes through the laminate disposed in a selected pattern at each of a plurality of integrated circuit mounting stations on the card, each plurality of holes defining a first group of holes and a second group of holes,
3. a conductive pin mounted in each of said holes, the pins in the first group holes comprising termination pins having ends exposed at one side of the laminate and the pins in the second group holes comprising mounting pins having opposite ends exposed at the opposite sides of the laminate, the mounting pins defining substantially the boundary of the corresponding station and being adapted at their ends adjacent the other side of the laminate for connection thereto of leads from an integrated circuit device for support of the device adjacent the said other side of the laminate, the termination pins at each station being disposed inwardly from the station boundary, and
4. means for connecting a lead to each of the laminate metallic layers separately from the other metallic layers at a selected location on the card,
5. the second metallic layer and the resistance layer being spaced sufficiently from the boundaries of the holes in the second group to be isolated from the mounting pins,
6. the second metallic layer within the boundary of each station being removed from the laminate around each of the holes in each first group according to a first scheme and the resistive layer within each station boundary being removed from the laminate adjacent to each of the holes in each first group according to a second related scheme so that the second metallic layer is electrically coupled separately to each of the termination pins by respective separate strips of said resistance layer which define within each station a resistor of selected impedance between each of the termination pins and the second metallic layer,
7. the mounting pins having no contact with the first and third metallic layers,
8. first specified ones of the mounting pins being in conductive contact with the first metallic layer but not with the second and third metallic layers, second specified ones of the mounting pins being in conductive contact with the third but not the first and second metallic layers, and the remaining mounting pins having no contact with any of the metallic layers.

19. A logic card according to claim 18 wherein the resistors have uniform values of impedance.

20. A logic card according to claim 19 wherein said remaining mounting pins define constant impedance feed-throughs in the laminate.

21. A logic card according to claim 20 wherein the impedance of said feed-throughs is substantially equal to the resistor impedances.

22. A logic card according to claim 18 wherein the first metallic layer is disposed on the other side of the laminate and defines an exterior surface of the laminate, the first metallic layer being electrically and thermally conductive and being sufficiently thick relative to the second metallic layer to serve in use of the card as a heat sink.

23. A logic card according to clam 22 wherein the first metallic layer is comprised of aluminum.

24. A logic card according to claim 22 wherein the third metallic layer is similar to the first metallic layer and defines an exterior surface of the laminate.

25. A logic card for selective wired interconnection of emitter coupled logic integrated circuits and the like comprising
1. a laminate comprising first, second and third relatively highly conductive layers insulated from each other, and a relatively poorly conductive resistance layer in conductive surface-to-surface contact with one surface of the second conductive layer and insulated from the adjacent one of the first and third layers,
2. a selected plurality of holes through the laminate in selected patterns at each of a plurality of circuit mounting stations on the laminate, the holes in each plurality defining first and second groups of holes,
3. a conductor disposed in each of the holes in each pattern, the conductors disposed in the second group holes comprising mounting conductors exposed on opposite sides of the laminate and the conductors disposed in the first group holes comprising termination conductors exposed on one side of the laminate, the termination conductors in each pattern being conductively engaged with at least one of the second layer and the resistive layer, the mounting conductors defining substantially the boundary of the corresponding pattern and being adapted at their ends adjacent the other side of the laminate for connection thereto of leads from an integrated circuit for support of the circuit adjacent the other side of the laminate, the termination conductors at each station being disposed inwardly from the station boundary ,
4. the second layer and the resistive layer being selectively and cooperatively removed from the laminate in the vicinity of the first group of holes in each pattern substantially within the station boundary in such manner that the second layer outside each vicinity at each station is conductively engaged with each of the termination conductors at each station only via a separate path defined by the resistive layer, each such path comprising an impedance of selected value,
5. means conductively connecting at least a first one of the mounting conductors at each station to the first layer but not to the second and third layers, and conductively connecting at least a second one of the mounting conductors at each station to the third but not to the first and second layers, the total of the first and second ones of said mounting conductors at each station being less than the number of mounting conductors at each station being out of conductive contact with the first, second, and third layers, and 6. means for connecting a lead to each of the conductive layers at a selected location on the card separately from the other conductive layers.

26. A logic card according to claim 25 wherein each station is substantially contiguous to at least one other station.

27. A logic card for mounting of integrated circuit devices threto and for selective interconnection of mounted integrated circuit devices, the card comprising (1) a laminate which includes a relatively highly conducting layer, (2) a plurality of conductors carried by the laminate at each of a plurality of integrated circuit device mounting stations defined on one of two opposite sides of the laminate, the conductors comprising a first group of termination conductors and a second group of mounting conductors at each station, (a) the mounting conductors at each station being effectively exposed on the opposite sides of the laminate and disposed out of contact with the conductive layer, the mounting conductors at each station being disposed to define substantially the boundary of the station and disposed in a selected pattern of n mounting conductors corresponding to the arrangement and relative spacing of a corresponding plurality of n conductive leads from an integrated circuit device of specified external configuration, whereby an integrated circuit device of appropriate configuration can be mounted to the card at the station by connection of the leads thereof to the station's mounting conductors adjacent the one side of the laminate, (b) the termination conductors at each station being disposed inwardly of the station's mounting conductors relative to the center of the station and effectively exposed at least on the other side of the laminate, the number p of termination conductors at each station being less than (n-2) wherein n is the number of mounting conductors at the corresponding station, (3) separate means connected between each of the termination conductors and the laminate conductive layer at each station and defining between the layer and each termination conductor a separate transmission line termination device in conductive connection between a corresponding termination conductor and the laminate conductive layer, each said separate means being carried by the laminate as a part thereof within the boundary of the corresponding station, whereby an integrated circuit device mounted at one station adjacent the one side of the laminate can be connected to receive a signal from another device similarly mounted at another station by a conductor wire disposed adjacent the opposite side of the laminate and connected (a) between selected ones of the mounting conductors at each of the two stations and (b) to any one of the termination conductors at the one station or an adjacent station, and (4) connection means at a selected location on the card for connecting a lead to the conducting layer for application to the conducting layer of a selected signal and via the conducting layer to all of the transmission line termination devices.

28. A logic card according to claim 27 wherein, at at least one station, the number p of termination conductors is substantially less than (n-2).

29. A logic card according to claim 27 wherein, at at least one station, the number p of termination conductors is less than (n-2)/2.

* * * * *